United States Patent [19]
Toda

[11] Patent Number: 5,687,351
[45] Date of Patent: Nov. 11, 1997

[54] DUAL PORT VIDEO MEMORY USING PARTIAL COLUMN LINES

[75] Inventor: Haruki Toda, Yokohama, Japan

[73] Assignee: Kabushiki Kaisha Toshiba, Tokyo, Japan

[21] Appl. No.: 278,267

[22] Filed: Jul. 21, 1994

[30] Foreign Application Priority Data

Jul. 21, 1993 [JP] Japan ............................ 5-180440

[51] Int. Cl.⁶ .......................... G06F 12/00; G11C 7/00; G11C 8/00
[52] U.S. Cl. .......................... 395/476; 395/436; 395/431; 365/230.05; 365/230.09
[58] Field of Search ...................... 395/436, 428, 395/476, 411, 431; 365/230.09, 230.03, 230.05, 230.04, 189.04, 189.05, 205, 221, 233, 51, 63

[56] References Cited

U.S. PATENT DOCUMENTS

| | | | |
|---|---|---|---|
| 4,947,373 | 8/1990 | Yamaguchi et al. | 365/189.04 |
| 5,065,369 | 11/1991 | Toda | 365/230.05 |
| 5,115,413 | 5/1992 | Sato et al. | 365/230.09 |
| 5,265,050 | 11/1993 | McLaury | 365/189.01 |
| 5,313,431 | 5/1994 | Uruma et al. | 365/230.05 |
| 5,319,603 | 6/1994 | Watanabe et al. | 365/230.05 |
| 5,463,591 | 10/1995 | Aimoto et al. | 365/230.05 |

*Primary Examiner*—Jack B. Harvey
*Assistant Examiner*—Ario Etienne
*Attorney, Agent, or Firm*—Loeb & Loeb LLP

[57] ABSTRACT

A dual port video memory having both a random access memory and a serial access memory is provided. Memory cell column lines are provided in a memory cell array for constructing the random access memory. Each of the memory cell column lines is divided into a plurality of partial column lines. Data is sensed in each of the partial column lines in correspondence to the row selected during random access. A serial register of serial access memory is provided on each side of two adjacent memory cell column lines. These registers are connected to the two adjacent memory cell column lines via gate elements for data transfer of the random access memory and the serial access memory. By selectively controlling the gate elements, it is possible to use the four-divided partial column lines as transfer paths when deactivated, thus reducing the power consumption and improving the integration rate of the video memory. Further, the video memory is capable of providing to various transfer modes.

7 Claims, 4 Drawing Sheets

FIG. 4

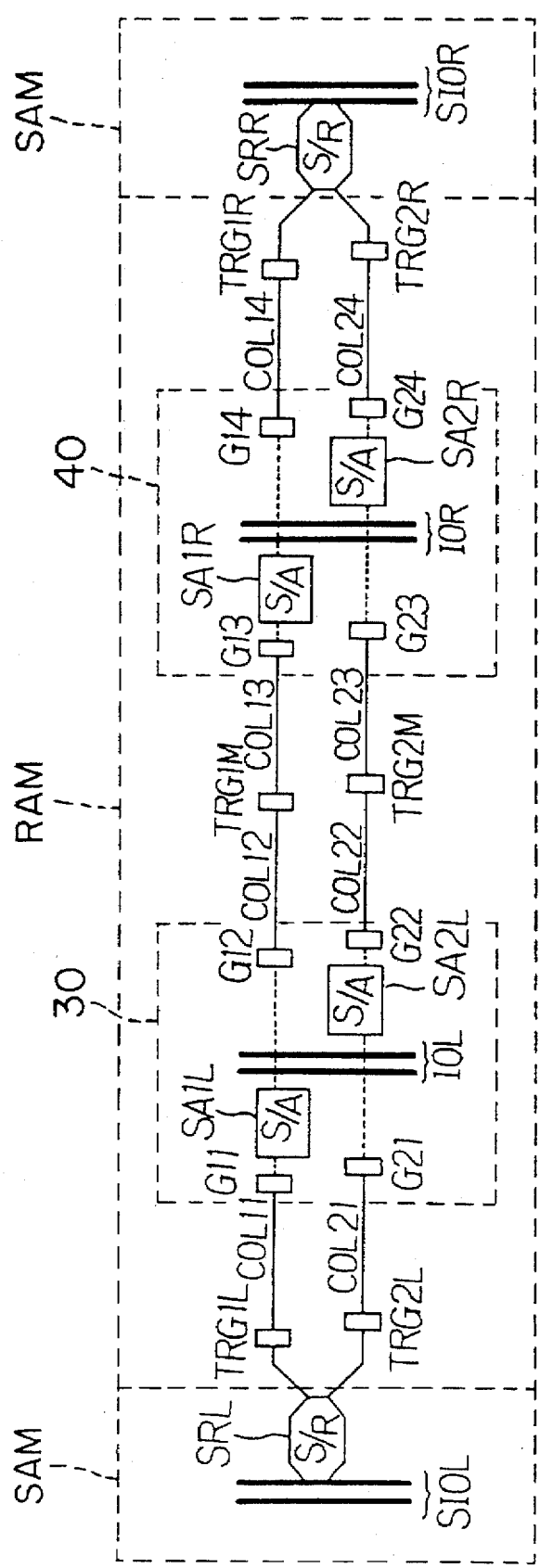
F I G. 5

DUAL PORT VIDEO MEMORY USING PARTIAL COLUMN LINES

BACKGROUND OF THE INVENTION

The present invention relates to a dual port video memory having both a random access memory (referred to as RAM, hereinafter) and a serial access memory (referred to as SAM, hereinafter), and more specifically to the configuration of a memory cell array suitable for constructing a memory chip of large capacity.

As is well known, the dual port video RAM (referred to as DPVRAM, hereinafter) is used as a memory for processing video data, the RAM and the SAM are both formed on a single chip. In the RAM and the SAM of the DPVRAM, data can be inputted thereto and outputted therefrom without synchronism. In addition, the DPVRAM is provided with such functions that data can be transferred from the RAM to the SAM or vice versa in a single transfer cycle. That is, data for one line of the RAM can be transferred in the case of the ordinary mode, and data for ½ line of the RAM can be transferred in the case of the spilt transfer mode.

On the other hand, since the capacity of the memory has been increased more and more, when memory cell data of all the selected columns are sensed in the RAM, since current consumption inevitably increases, there exists a problem in that the power consumption increases in opposition to a strong demand for power saving. Accordingly, it has been proposed that the cell data sensing operation be divided in the RAM to decease the power consumption.

FIG. 1 shows an example of configuration of the interface portion between the RAM and the SAM in the DPVRAM of divided sensing operation type.

In FIG. 1, in order to realize the two-divided sensing operation in the RAM, each column line of the memory cells is divided into two and further a serial register S/R is arranged at the middle portion of the interface in each column line. For instance, the memory cell column line COL1 is divided into two partial column lines COL1L and COL1R. The partial column line COL1L is connected to a data line IOL via a sense amplifier (S/A) SA1L, and the partial column line COL1R is connected to a data line IOR via a sense amplifier (S/A) SA1R. Furthermore, a transfer gate TRG1L is connected between the partial column line COL1L and the serial register (S/R) SR1. The same construction as above is applied to the partial column lines COL2L and COL2R in the second column line.

Furthermore, as is well known, a predetermined number of word (row) lines are arranged in a direction perpendicular to these column lines. A plurality of memory cells are connected to intersections between these column lines and the word lines, respectively. In the following description and the drawings, however, these memory cells are not illustrated for brevity.

The operation of the DPVRAM shown in FIG. 1 will be described hereinbelow.

When a row is selected, only the partial column lines COL1L and COL1R are activated, and data access to the RAM is effected through data lines IOL and IOR. Furthermore, the serial registers S/R of the SAM can access to either side of the divided RAM by opening the transfer gate TRG1L or TRG1R. Further, the data access to the SAM is effected through the data lines SIO.

In the case where the column line is divided as described above, it is possible to transfer data in the split transfer operation mode. In more detail, the transfer gates (TRG1L and TRG1R, and TRG2L and TRG2R) are activated independently by use of the partial column line COL1 belonging to the upper half SAM and the partial column line COL2 belonging to the lower half SAM, respectively.

However, as the memory capacity has been further increased and the power saving is required further, it has become necessary to further divide the RAM operation.

FIG. 2 shows an example of the configuration where the RAM operation is divided into four. In FIG. 2, the first memory cell column line COL1 is divided into four partial column lines COL11, COL12, COL13 and COL14. A sense amplifier SA1L is connected between partial column lines COL11 or COL12 via a gate G11 and G12. A sense amplifier SA1R is connected between the partial column lines COL13 and COL14 via a gate G13 or G14. A serial register SR1 is provided between the partial column lines COL12 and COL13. The sense amplifier SA1L is connected to the serial register SR1 via a transfer gate TRG1L, and the sense amplifier SA1R is connected to the serial register SR1 via a transfer gate TRG1R, respectively. The same construction as above is applied to the memory cell column line COL2. Furthermore, data lines IOL are provided for the sense amplifiers SA1L and SA2L; data lines IOR are provided for the sense amplifiers SA1R and SA2R; and the other data lines SIO are provided for the serial registers SR1 and SR2, respectively.

In the configuration as described above, it is possible to operate the transfer gates (TRG1L and TRG1R, and TRG2L and TRG2R) independently and further to select the partial column lines connected to the selected sense amplifiers by controlling the gates G11 and G14 and G21 to G24, respectively.

With reference to FIG. 2, when the partial column lines COL12 and COL22 are activated, for instance, the data gates G12 and G22 connected to the sense amplifiers SA1L and SA2L are opened, so that the data can be sensed. At this time, data are transferred between the RAM and the outside through the data lines IOL. Further, data can be transferred to the serial registers SR1 and SR2 of the SAM by opening the data transfer gates TRG1L or TRG2L, respectively. At this time, data are transferred between the SAM and the outside through the data lines SIO.

The split transfer can be made by controlling the open/close conditions of the transfer gates (TRG1L and TRG1R, and TRG2L and TRG2R) independently in the same way as described with reference to FIG. 1.

In the case of a memory with large capacity, the elements are integrated to the maximum extent by using microminiaturization processing techniques. In this case, since the integration rate can be increased by reducing the column line pitch of the memory cells in the row line direction, there exists a strong demand for reducing the column line pitch of the memory cells. Therefore, it is impossible to form wiring (other than the memory cell column lines) in the same layer as that in which the memory cell column lines are formed. Further, since data must be transferred to and from any partial column lines of the RAM, it is necessary that all the sense amplifiers in the memory cell column lines are connected to the serial registers of the SAM.

To realize the above-mentioned wire connection, therefore, data lines must be formed in a layer different from both the layer in which the memory cell lines are formed and the layer (perpendicular to the memory cell line layer) in which the word lines are formed. In FIG. 2, the data lines are shown by thick solid lines to realize the above-mentioned wire connection.

Where the highly integrated memory cell array is formed on the basis of a multilayer, it is difficult to arrange the serial register for each column, because of the restriction of the column line pitch of the memory cells.

To reduce the chip size as much as possible while solving the above-mentioned problems, such a configuration that only a single serial register is arranged for two column lines has been proposed. FIG. 3 shows an example of this configuration.

In the configuration shown in FIG. 3, a serial register SRC used in common for the two column lines of the memory cells is provided. Further, the sense amplifier SA1L is provided on the side of the partial column line COL11 relative to the data lines IOL, and the sense amplifier SA2L is provided on the side of the partial column line COL22 relative to the data lines IOL. In addition, the sense amplifiers SA1L and SA2L are arranged on the opposite sides, respectively with respect to the data lines IOL, alternately for each column.

In FIG. 3, two memory cell column lines belonging to the upper half and the lower half of the SAM are shown. In this configuration, however, it is impossible to allow the partial column line COL1 to correspond to the upper half of the SAM and similarly the partial column line COL2 to correspond to the lower half of the SAM, being different from the configuration as shown in FIG. 2, with the result that it is impossible to read the data of the different partial column lines COL1 and COL2 in series. This raises a problem in that there exists no interchangeability between the prior art memory cell as shown in FIG. 3 and the prior art memory cell as shown in FIG. 2 (in which a serial register is provided for each column line of the memory cells in a one-to-one corresponding relationship).

In addition, in both the prior art memory cells as shown in FIGS. 2 and 3, in order to transfer data between the RAM or SAM and the outside; that is, to connect the data lines IOL, IOR and SIO to specific memory cell column lines and registers, signal lines for transferring signals given from a decoder to the gates must be arranged in parallel to the column lines of the memory cells. Therefore, there exists another problem in that the number of wiring layers is further increased inevitably because of the additional patterning of the above-mentioned signal lines.

SUMMARY OF THE INVENTION

With these problems in mind, therefore, it is the object of the present invention to provide a video memory of DPVRAM type, by which the conventional memory cell column lines and the serial registers can be arranged in a one-to-one corresponding relationship, even when the memory cell column line pitch is reduced as a result of micro-miniaturization of the memory cells, by which the cross-transfer can be realized by interchanging the upper half SAM with the lower half SAM or vice versa for the spilt transfer operation, and by which the same operation as when one serial register is provided for two memory cell column lines can be easily realized by changing the sequence of access corresponding relationship.

To achieve the above-mentioned object, the video memory according to the present invention includes:

a random access memory portion having a memory cell array having a plurality of memory cells arranged in row and column directions into a matrix form, the random access memory cell array having a plurality of word lines and a plurality of column lines;

serial access memory portions each composed of a register, the register being arranged on each side of the two adjacent column lines; and data transfer control means arranged between the register and each of the two adjacent column lines for controlling data transfer of the random access memory and the serial access memory, each of the column lines being divided into a plurality of partial column lines so that data of the memory cell is sensed in each of the partial column lines in correspondence to the row selected during random access.

Further it is preferable that data are transferred between the selected partial column line and the register of the serial access memory by using the non-selected partial column line of the memory cell column lines as data transfer paths.

Further it is preferable that the two registers of the serial access memory each provided on each side of two memory cell column lines are used as two partial serial registers so as to correspond to a first half serial access and a second half serial access, in split transfer mode such that the serial access is divided into a first half serial access and a second half serial access so that data can be transferred to and from the random access memory independently in each divided half access; and data are transferred from the partial column lines corresponding to the two adjacent column lines on the basis of the data transfer by the first half serial access and the data transfer by the second half serial access.

Further, it is desirable that each of the memory cell column lines is divided into first, second, third and fourth partial column lines; two sense amplifiers are preferably respectively connected between the first and second partial column lines and between third and fourth partial column lines via a gate element; and further a data transfer gate is provided between the second and third partial column lines.

Further, it is desirable that the two sense amplifiers for the two adjacent memory cell column lines are arranged on opposite sides with respect to each other relative to the data lines.

Further, it is desirable that the data are transferred from either of two columns to a serial register by appropriately changing the corresponding relationship between the left and right halves of the SAM and the upper and lower halves of the RAM.

Further, it is desirable that in a first data transfer cycle, data are transferred from the upper side memory cell column line to the left side serial register SRL, and similarly in the succeeding second data transfer cycle, data are transferred from the upper side memory cell column line to the right side serial register SRR.

In the video memory according to the present invention, since one of the serial registers of the SAM is arranged on both sides of the two adjacent memory cell column lines of the memory cell array for constituting the RAM operable in divisional mode, it is possible to transfer data between the partial column line corresponding to the divisional operation and the register by use of the bit line of deactivated partial column line; to correspond each of the two memory cell column lines to each of the upper and lower halves of the SAM column lines in split data transfer; and to connect one of the registers arranged on both sides of the two adjacent column lines to the left half SAM and the other of the same registers to the right half SAM, thus enabling data cross transfer by selectively connecting one of these registers to either of the upper or lower half partial column lines via gate elements. In addition, in the video memory according to the present invention, when only one of the registers arranged on both sides of the two adjacent column lines is used for data access, it is possible to operate the video memory so as to satisfy the same operational specification as that in which only a single register is provided for two adjacent memory cell column lines.

BRIEF DESCRIPTION OF THE DRAWINGS

In the attached drawings:

FIG. 4 is a plan view showing a layout of the memory chip according to the present invention;

FIG. 5 is a model view showing the configuration according to the present invention, in which an interface portion between the RAM and SAM of DPVRAM for realizing the four-divisional sensing operation is shown.

DETAILED DESCRIPTION OF THE EMBODIMENTS

Figure 4:
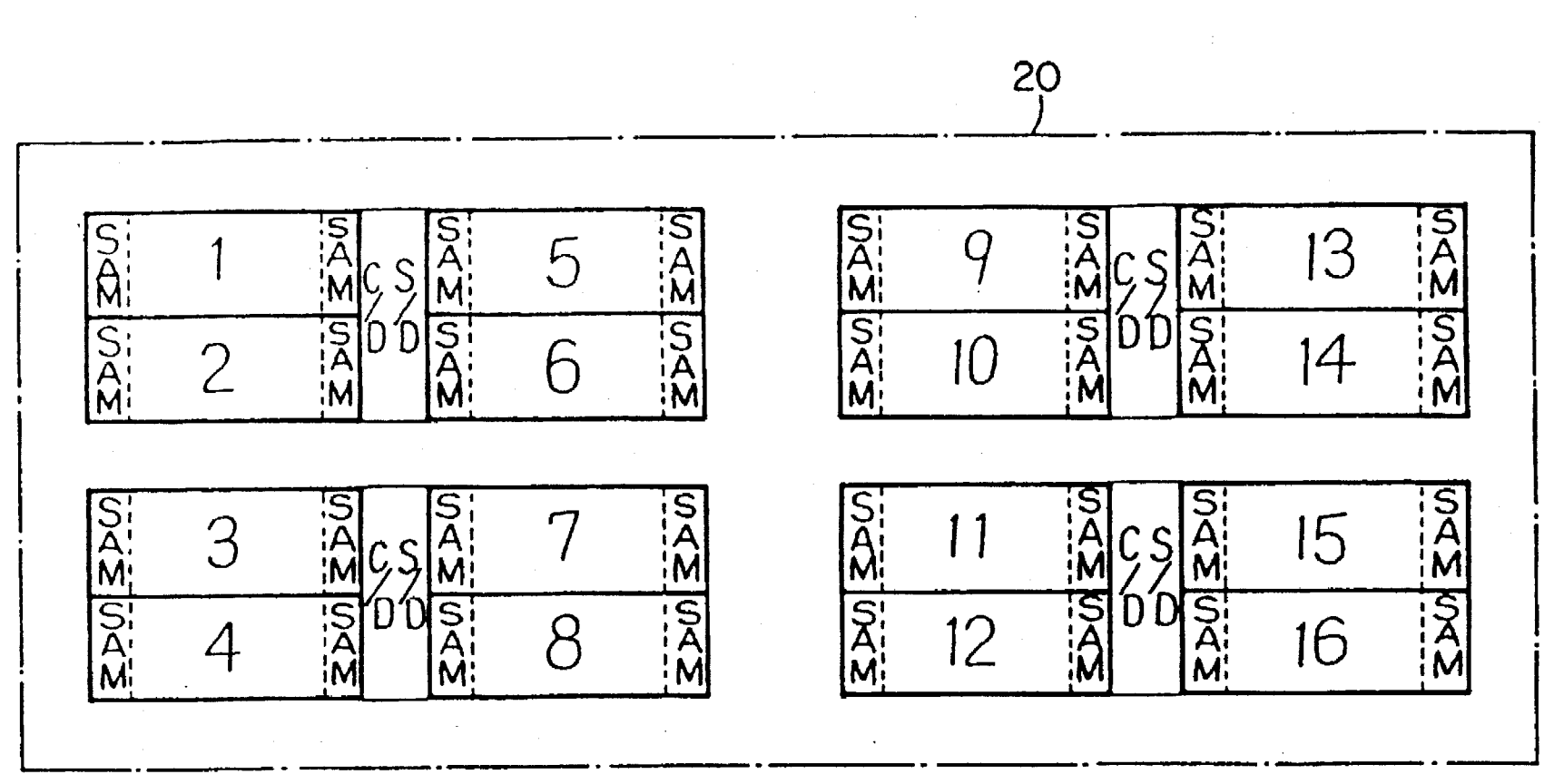
Figure 1:
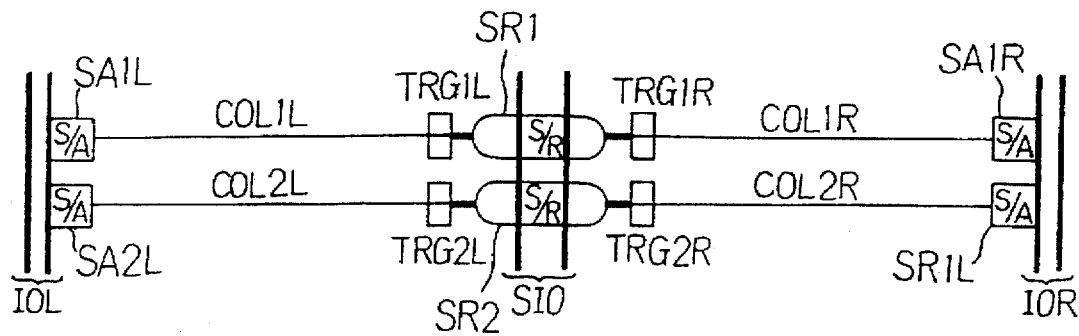
FIG. 1 is a model view showing a prior art configuration of the columns and the serial registers at an interface portion between the RAM and SAM of DPVRAM for realizing the two-divisional sensing operation.
Figure 2:
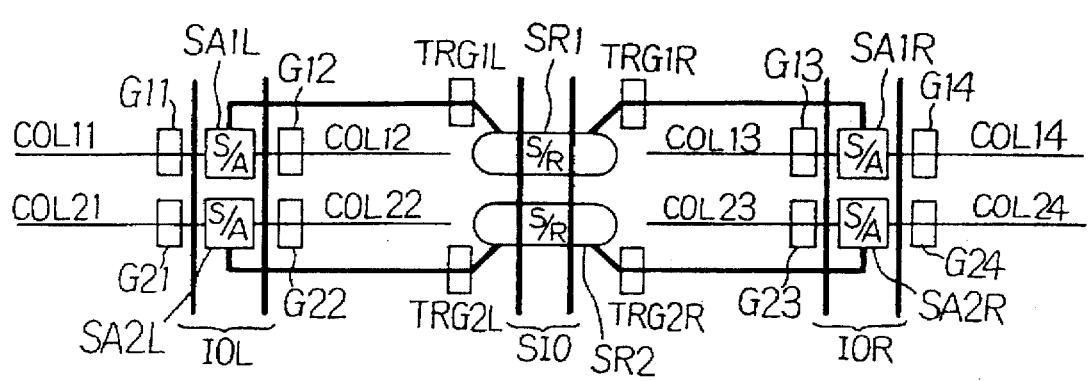
FIG. 2 is a model view showing a prior art configuration of the columns and the serial registers at an interface portion between the RAM and SAM of DPVRAM for realizing the four-divisional sensing operation.

FIG. 4 is a plan view showing an example of a video memory chip 20, to which the configuration of the memory cell column lines and the serial registers according to the present invention is applied.

In FIG. 4, there is shown a part of the video memory having SAMs and 16-bit parallel output RAMs constructed by a memory cell array composed of memory cells arranged in row and column directions into a matrix pattern. The reference numerals 1 to 16 denote parts, each of which corresponds to each bit of the RAM. On both sides of each RAM portion, the SAM portions are provided. Furthermore, the RAM portions for 4 bits form a single configuration unit (e.g., the RAM portions for bits 1, 2, 5 and 6 form a single unit). A column decoder C/D and a serial decoder S/D are both provided at the central portion of each configuration unit. The column decoder C/D and serial decoder S/D can be used in common for the memory cell arrays arranged on both sides thereof.

Figure 3:
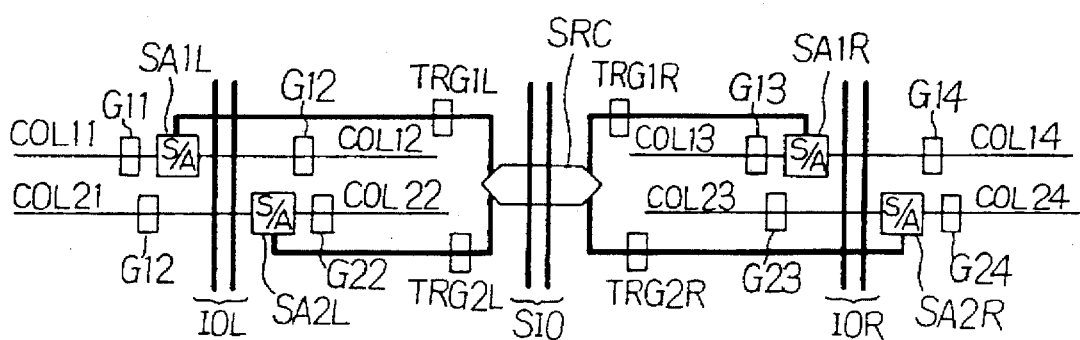
FIG. 3 is a model view showing a modification of the prior art configuration shown in FIG. 1, which is constructed for request of reducing the column pitch.

FIG. 5 shows one of the configuration units shown in FIG. 4. In FIG. 5, an interface portion between the RAM and the SAMs is similar to the case of the prior art interface portion as shown in FIG. 3 in that a single sense amplifier S/A and a single serial register S/R are allocated to the two memory cell portions. However, the configuration shown in FIG. 5 is different from that shown in FIG. 3 in that two serial registers SRL and SRR are arranged on both ends of the entire memory cell column lines, in such a way that the number of the memory cell column lines is equal to the number of the serial registers, and in that data transfer gates TRG1L, TRG1R, TRG2L and TRG2R are provided in such a way that the respective serial registers SRL and SRR can be selectively connected to any of the two adjacent column lines.

FIG. 5 shows two memory cell column lines of the RAM, which perform 4-divisional operation. Each memory cell column line has two sense amplifiers S/A and each sense amplifier S/A performs sensing operation for two partial column portions arranged on both sides of the sense amplifier.

In more detail, the upper side column line of the memory cells is composed of the partial column lines of COL11, COL12, COL13 and COL14. The sense amplifier SA1L is arranged between the two partial column lines COL11 and COL12, and the sense amplifier SA1R is arranged between the two partial column lines COL13 and COL14. In order to selectively connect one of the right and left side partial column lines COL11 and COL12 to the sense amplifier SA1L, a data gate G11 is provided between the partial column line COL11 and the sense amplifier SA1L, and a data gate G12 is provided between the partial column line COL12 and the sense amplifier SA1L. Further, in order to selectively connect one of the right and left side partial column lines COL13 and COL14 to the sense amplifier SA1R, a data gate G13 is provided between the partial column line COL13 and the sense amplifier SA1R, and a data gate G14 is provided between the partial column line COL14 and the sense amplifier SA1R. Further, a data transfer gate TRG1M is arranged between the partial column lines COL12 and COL13. Furthermore, a transfer gate TRG1L is connected between the serial register SRL and the column line COL11, and a transfer gate TRG1R is connected between the serial register SRR and the column line COL14.

Figure 6:
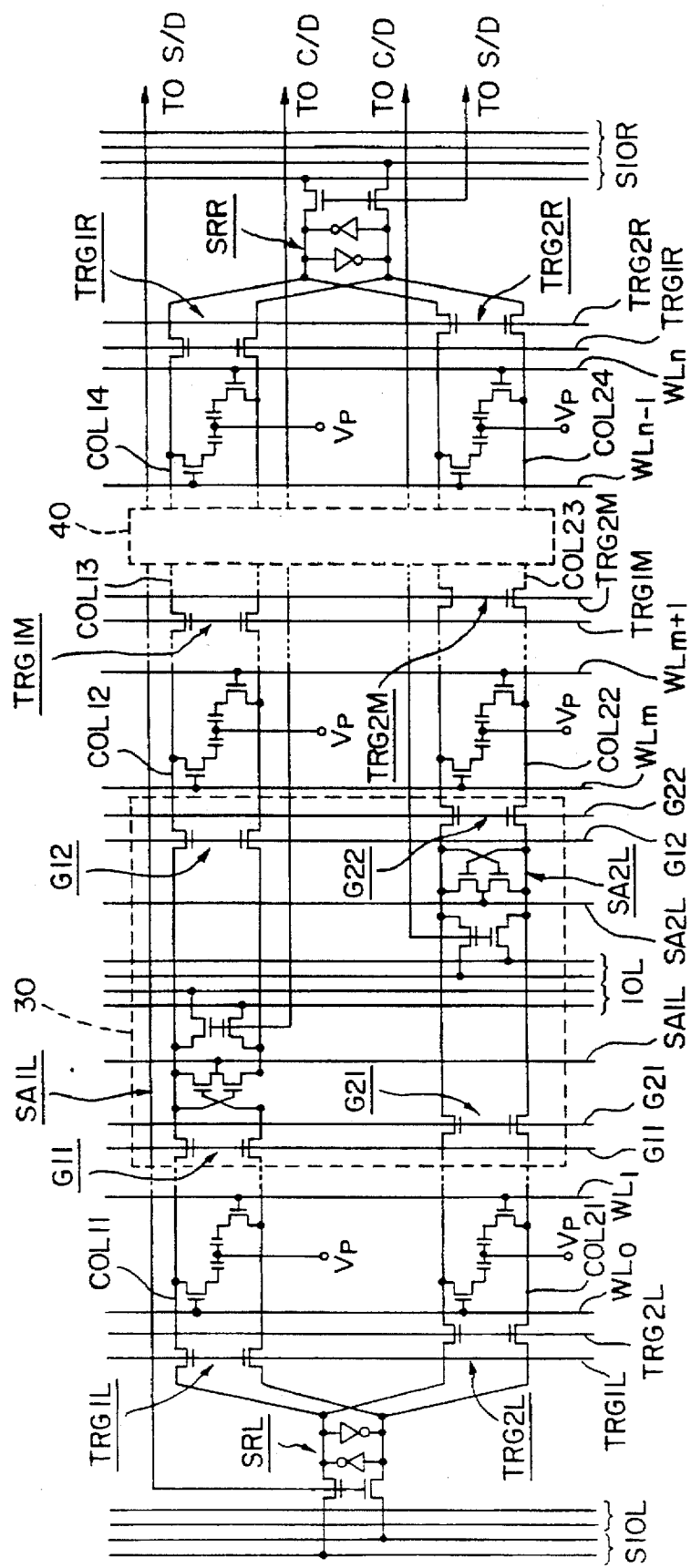
FIG. 6 is a view showing the detailed configurations of structural parts of FIG. 5.

FIG. 6 is a detailed circuit diagram which corresponds to FIG. 5. As shown in FIG. 6, all lines are comprised of a pair of lines. It should be noted that reference names are commonly used for both circuit elements and control signals thereof and that configurations from COL12 to COL14 and from COL22 to COL24 except for transfer gates TRG1M and TRG2M are omitted for brevity.

Each of serial registers SRL and SRR is comprised of a flip-flop circuit which has two inverters. A gate circuit having two MOS transistor switches whose gate electrodes are commonly connected and further connected to a serial decoder (not shown) is provided in proximity to the serial register to selectively effect the serial register.

Each of transfer gates TRG1L, TRG2L, TRG1M, TRG2M, TRG1R and TRG2R is comprised of two MOS transistors whose gate electrodes are commonly connected and controlled by a control signal of the same name as the transfer gate.

Each of data gates G11, G21, G12, G22, G13, G23, G14, G24 is comprised of a pair of MOS transistors whose gate electrodes are commonly connected and controlled by a control signal of the same name as the data gate.

Each of sense amplifiers SA1L, SA2L, SA1R and SA2R is comprised of a pair of cross-coupled MOS transistors. A gate circuit having two MOS transistor switches whose gate electrodes are commonly connected and further connected to a column decoder (not shown) is provided adjacent to the sense amplifier to selectively effect the sense amplifier.

A memory cell having a transistor and a capacitor is provided for an intersection part of the column line and a word line. For example, a transistor whose gate is connected to the word line WL0 is provided and its drain is connected to the column line COL11 and its source is connected to a power supply terminal Vp through a capacitor. As shown in FIG. 6, two transistors of two adjacent cells are commonly connected.

The column and serial register selecting lines extending from the column and serial decoders pass over the memory cell array.

The operation of this video memory will be described hereinbelow.

When the data gates are turned on and off, the partial column lines are activated by the turned-on data gates are connected to the sense amplifiers for sensing operation. For instance, when the partial column lines COL12 and COL22 are required to be activated, the data gates G12 and G22 are both turned on, so that only the left side sense amplifiers are activated. In other words, since only ¼ of the partial memory cell columns can be activated, it is possible to economize the power consumption markedly.

In the memory as shown in FIG. 5, under the condition that cell data is sensed and latched by the sense amplifier SA1L or SA2L arranged on the left side of the memory, the sensed data is transferred to the outside through the data lines IOL. Further, the latched data is transferred to the serial register by opening the transfer gate TRG1L or TRG2L.

In FIG. 5, it is possible to allow the upper side memory cell column lines to belong to the upper half of the SAM and the lower side memory cell column lines to belong to the lower half of the SAM. Further, the left side serial register SRL corresponds to the register of the upper half of the SAM, and the right side serial register SRR corresponds to the register of the lower half of the SAM. To transfer data latched by the left side sense amplifier SA1L to the serial register SRL in the upper side memory cell column line, the data gate G11 and the transfer gate TRG1L are both turned on. To transfer data latched by the left side sense amplifier SA2L to the serial register SRR in the lower side memory cell column line, the data gate G22, the data transfer gate TRG2R are all turned on. Further, data is passed through the sense amplifier SA2R, with the sense amplifier SA2R being in an inactivated state. As described above, the data latched by the sense amplifiers SA1L and SA2L are transferred to the serial registers SRL and SRR through the bit lines effective as data read nodes connected to the memory cells among the deactivated partial column lines. Further, the accesses to the serial registers are performed through the data lines SIOL or SIOR.

The operation of the cross data transfer will be described hereinbelow. Here, the cross transfer implies that data are transferred by approximately changing the corresponding relationship between the upper and lower halves of the SAM and the upper and lower halves of the RAM.

According to the present invention, since data from either of two columns can be transferred to a serial register, a cross data transfer can be realized easily by transferring data through the appropriate bit lines. That is, by appropriately controlling the turn-on/off operations of the related data transfer gates. In other words, in a data transfer cycle, data can be transferred from the upper side memory cell column line to the left side serial register SRL, and similarly in the succeeding data transfer cycle, data can be transferred from the upper side memory cell column line to the right side serial register SRR.

Further, in the transfer cycle (not the split transfer), although data of the sense amplifiers are transferred to the both side registers simultaneously, in the case of the configuration as shown in FIG. 5, four different modes can be realized on the basis of the corresponding relationship between the upper and lower halves of the RAM.

In more detail, in the first mode, data are transferred by connecting the upper column line to the left side register, and the lower column line to the right register. In the second mode, data are transferred by connecting the lower column line to the left side register, and the upper column line to the right register. In the third mode, data are transferred by connecting the upper column line to both the right and left registers, simultaneously. In the fourth mode, data are transferred by connecting the lower column line to both the right and left registers, simultaneously. These various data transfer modes as described above can be realized easily by controlling the turn-on/off operations of the various gates shown in FIG. 5.

Further, the memory shown in FIG. 5 can operate so as to correspond to the specifications of the video memory products of such a conventional type that a single serial register is provided for each two memory cell column lines as explained with reference to FIG. 3. In this case, the turn-on/off operations of the transfer gates are controlled on the assumption that either of the right or left side register is not present.

As described above, in the video memory according to the present invention, it is possible to construct the DPVRAM in such a way that the columns and the serial registers are arranged in one-to-one corresponding relationship with respect to each other as is conventional, even in the memory cell of large capacity in which an extremely small pitch is required for the memory cell column lines.

Furthermore, since the data transfer between the sense amplifiers of the RAM and the serial registers of the SAM can be made by use of the partial column lines now being not activated, since no additional wiring layer for connecting the RAM to the SAM is needed, and further since the selecting signal lines extending from the decoder can be formed in the wiring layer conventionally used to form the data lines for connecting the RAM to the SAM, it is possible to simplify the configuration of the memory cell array.

As described above, in the video memory according to the present invention, since the four-divided partial column lines can be used as the transfer paths whenever deactivated by the gating means provided midway along the partial column lines, it is possible to decrease the current consumption and the number of the wiring layers, thus improving the integration rate of the video memory.

In addition, it is possible to realize the data cross transfer and to further operate the memory so as to correspond to the specifications of the video memory products of such a conventional type that a single serial register is provided for each two memory cell column lines.

What is claimed is:

1. A video memory comprising:

a random access memory (RAM) portion having a memory cell array having a plurality of memory cells arranged in row and column directions into a matrix form, said random access memory cell array having a plurality of word lines and a plurality of column lines, each of said column lines including a pair of lines;

serial access memory (SAM) portions each composed of a pair of registers, said pair of registers including a first register and a second register, said first register being arranged on one end of two adjacent column lines and said second register being arranged on another end of said two adjacent column lines; and data transfer control means, arranged between said first register and each of said two adjacent column lines and between said second register and each of said two adjacent column lines, for controlling data transfer of said random access memory and said serial access memory, wherein each of said column lines is divided into a plurality of partial column lines so that data of selected memory cells is sensed on the partial column lines in correspondence to the row selected during random access.

2. The video memory of claim 1, wherein data are transferred between a selected partial column line and one of the registers of said serial access memory by using at least one non-selected partial column line of said column lines as a data transfer path.

3. The video memory of claim 1,
wherein the first and second registers of said serial access memory are used as two partial serial registers so as to correspond to a first half serial access and a second half serial access in split transfer mode, serial access being divided into the first half serial access and the second half serial access so that data can be transferred to and from said random access memory independently in each divided half access, and
data are transferred from the partial column lines corresponding to said two adjacent column lines on the basis of the data transfer by the first half serial access and the data transfer by the second half serial access.

4. The video memory of claim 1,
wherein each of said column lines is divided into first, second, third and fourth partial column lines,
one sense amplifier is connected between said first and second partial column lines and another sense amplifier is connected between said third and fourth partial column lines via gate elements, and
a data transfer gate is provided between the second and third partial column lines.

5. The video memory of claim 4, wherein said sense amplifier connected between said first and second partial column lines of one of said two adjacent column lines and said sense amplifier connected between said first and second partial column lines of the other of said two adjacent column lines are arranged on opposite sides of data lines.

6. The video memory of claim 1, wherein data are transferred from either one of said two adjacent column lines to one of the pair of registers by appropriately changing the corresponding relationship between the left and right halves of the SAM and the upper and lower halves of the RAM.

7. The video memory of claim 6, wherein in a first data transfer cycle, data are transferred from the upper side column line to the left side register, and in a second data transfer cycle, data are transferred from the upper side column line to the right side register.

* * * * *